US006573762B1

(12) United States Patent

Wessendorf et al.

(10) Patent No.: US 6,573,762 B1

(45) Date of Patent: Jun. 3, 2003

(54) ANALOG PULSE PROCESSOR

(75) Inventors: Kurt O. Wessendorf, Albuquerque, NM (US); Dale A. Kemper, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/435,091

(22) Filed: Nov. 5, 1999

(51) Int. Cl.[7] .............................................. H03K 17/00

(52) U.S. Cl. .......................... 327/100; 327/74; 327/91; 702/189; 250/370.01

(58) Field of Search ........................ 327/50, 51, 58–60, 327/63, 72, 74, 90, 91, 94–95, 100, 103, 104; 250/336.1, 370.01–370.09, 370.1; 702/189–194; 356/319, 325

(56) References Cited

U.S. PATENT DOCUMENTS

| | | | | |
|---|---|---|---|---|
| 4,021,667 A | * | 5/1977 | Clausen et al. | 250/336.1 |
| 5,774,522 A | * | 6/1998 | Warburton | 250/370.06 |
| 5,831,742 A | * | 11/1998 | Watson et al. | 356/325 |

* cited by examiner

*Primary Examiner*—Minh Nguyen

(74) *Attorney, Agent, or Firm*—Gregory A. Core; John P. Hohimer

(57) ABSTRACT

A very low power analog pulse processing system implemented as an ASIC useful for processing signals from radiation detectors, among other things. The system incorporates the functions of a charge sensitive amplifier, a shaping amplifier, a peak sample and hold circuit, and, optionally, an analog to digital converter and associated drivers.

14 Claims, 6 Drawing Sheets

ANALOG PULSE PROCESSOR

STATEMENT REGARDING FEDERALLY SPONSORED RESEARCH

This invention was made with Government support under Contract DEAC04-94AL85000 awarded by the U.S. Department of Energy. The Government has certain rights in the invention.

CROSS REFERENCE TO RELATED APPLICATIONS

Not applicable.

BACKGROUND OF THE INVENTION

Conventional pulse processing electronics for detectors and sensors consume relatively large amounts of power and are often unsuitable for use outside the laboratory because of their size. Lower power charge preamplifier circuits have been successfully developed. However, for long term unattended monitoring applications, the entire pulse processing system (preamplifier, shaping amplifier, sample-hold) must also be a very low power solution. Also, due to system-size constraints and ease of use it is highly desirable to integrate said pulse-processor system onto a single silicon chip. No such system exists at the present time. The system described herein satisfies this unmet need in the technology. It is particularly useful for processing the signals from semiconductor radiation detectors but can be used for other detector and sensor signals as well.

BRIEF SUMMARY OF THE INVENTION

The system of circuits disclosed herein is intended to perform the same functions as the separate charge sensitive amplifier, shaping amplifier, and peak sample and hold systems already in use in the prior art. However, the present system was created to minimize packaging volume and power consumption and is intended to be implemented as an application specific integrated circuit (ASIC). This core system can be designed to interface with an off-chip flash analog to digital converter (ADC) for subsequent height analysis, or the system can be expanded to include the ADC, with or without its drivers, as part of the ASIC albeit with a higher power budget. Low average power for the present system is achieved by making the high current functions enabled only when the desired input pulse amplitude is detected. Novel circuit design techniques are used to minimize power consumption while providing good linearity and low-noise circuit performance.

DETAILED DESCRIPTION OF THE INVENTION

The circuit was designed to operate off of a 7 V (±3.5 V) power supply and to be used with a cadmium zinc telluride (CZT) detector to provide pulse height spectroscopy from 0 to 1.0 MeV with an energy resolution of at least 20 keV FWHM. Assuming a mean electron-hole pair creation energy in CZT of 5.0 eV these design specifications translate into a "charge gain" of 58.6 $\mu$V/keV (133 mV/fC) and an equivalent noise charge (ENC) of less than 1700 electrons rms. However, by altering the effective feedback capacitance in the circuit, one may alter the gain for use with other detectors besides CZT. For instance, by increasing the "charge gain" of the circuit it should be possible to use the circuit as a readout for silicon p-i-n detectors attached to scintillators.

DESIGN OVERVIEW

Figure 1:
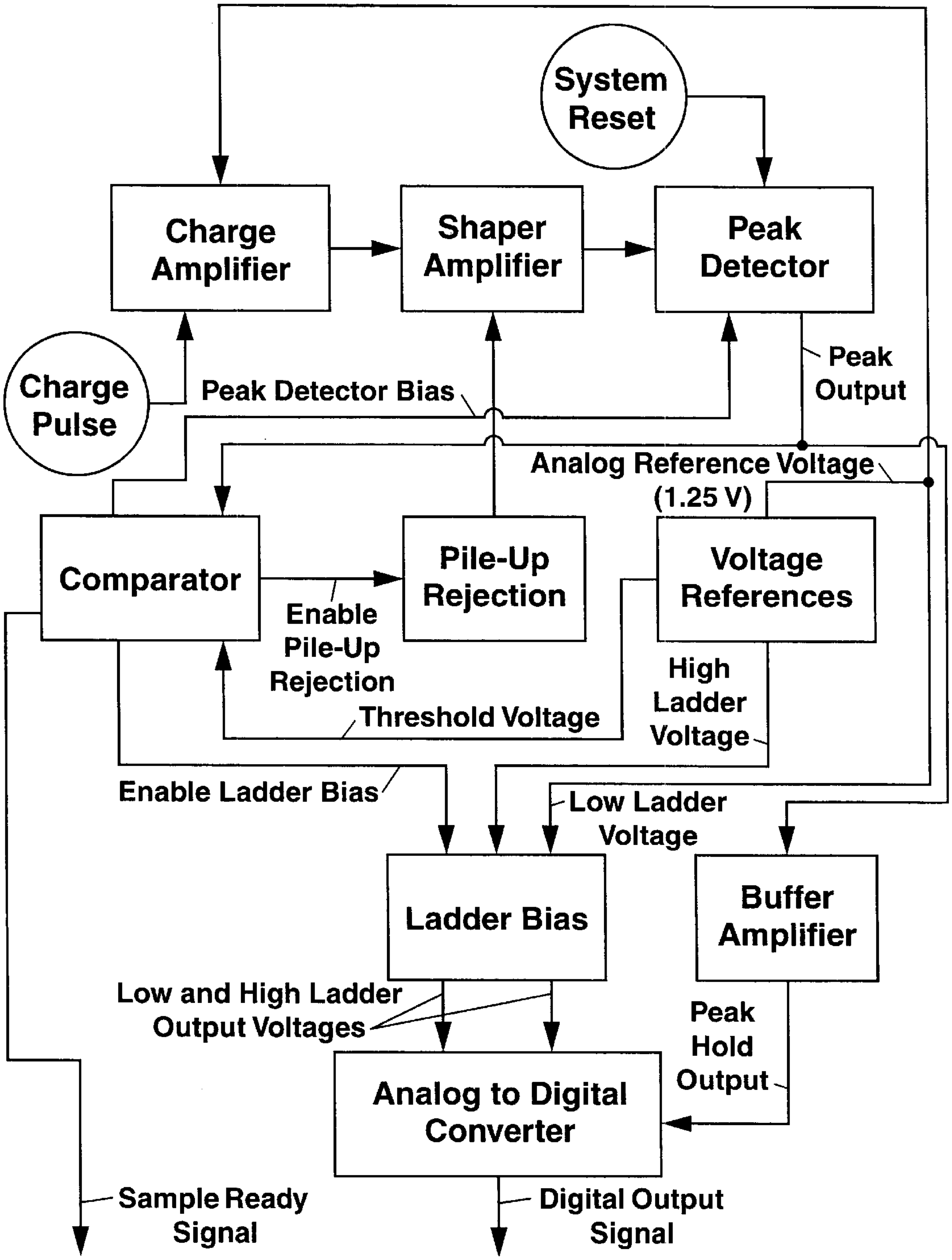
FIG. 1 is a schematic diagram of the various major subsystems in the system of this invention and how they cooperate with each other.

The ASIC performs the three analog pulse processing functions used in a semiconductor pulse height spectrometer: charge amplification, shaping, and peak sensing. A simplified block diagram of the ASIC circuit is shown in FIG. 1. The pulse processing ASIC shown herein is designed to work with a companion flash ADC and microcontroller to function as a complete ultra low-power gammaray pulse height spectrometer. However, these functions can also be integrated into the ASIC. In addition to its pulse processing functions, the ASIC also contains a circuit for biasing the external flash ADC reference input. The ASIC contains a circuit to provide common and precise reference voltages to all pertinent circuits in the ASIC. Finally the ASIC contains logic circuits that allow circuit functions to be enabled and disabled as required for function and power management.

The ASIC was designed to draw approximately 2 mA of current in the "idle mode" (no valid pulses present). When a pulse of appropriate amplitude triggers the circuit, its current draw will double. The circuit will then continue to draw 4 mA for the remainder of the pulse acquisition time (<10 $\mu$s). Additional current will also be drawn during pulse acquisition to provide a reference for the external flash ADC. The amount of additional current drawn will depend on the ladder network used in the external ADC.

This design uses a band-gap voltage reference to set the operating dc voltages of the entire system. Since the band gap voltage is very stable over temperature and power supply voltage, the system can be designed to exploit this stability. The voltage references block generates three dc voltages for the system. The 1.25 V analog reference voltage ($V_{ref}$) sets the steady state dc voltages for the charge-amplifier output. Since the dc gain of the shaper-amplifier, peak-detector and buffer amplifier is unity, the charge-amplifier sets the dc operating voltages of these function blocks. Therefore the output of the buffer is a peak-held dc voltage relative to $V_{ref}$ (1.25 V).

The voltage reference block provides a threshold dc voltage to the comparator. This voltage is slightly above $V_{ref}$ and is adjusted to reject circuit noise. When the peak-detector output rises above the threshold voltage ($V_{thresh}$) the pile-up rejection circuit and ladder bias circuits are enabled.

The voltage reference block also provides the high and low bias voltages to the ADC resistor ladder bias network. The high voltage is adjusted to approximately 6.0 V while the low voltage is $V_{ref}$ (1.25 V). The ladder bias block takes these low-current voltage references and applies these voltages to the low-value ladder resistor of the ADC converter. For the sake of minimizing system power consumption, the ladder bias circuit is enabled by the comparator when a nuclear pulse above $V_{thresh}$ is detected. The ladder resistor bias is maintained for the duration of the measurement which, in this design, is approximately 10 $\mu$s. After the sample has been digitized, the system is reset and returns to the lower power mode of operation (and remains in low power mode until another pulse of sufficient amplitude is produced by the detector).

The comparator block is used for four critical system functions: peak-detector bias control, ladder bias enabling, pile-up rejection and system noise rejection. These functions are enabled or disabled based on the sensing of a $V_{thresh}$ pulse input. The comparator provides bias to the output of the peak-detector such that the circuit is bi-directionally linear until the comparator senses an input pulse of amplitude greater than $V_{thresh}$. When the comparator senses this input pulse, the peak-detector bias is removed and the peak-detector accurately follows the peak amplitude of the input. The peak-detector capacitor holds this voltage with very little change during the time interval required for ADC conversion.

The comparator also enables the pile-up rejection circuit. The pile-up rejection circuit controls the ac gain of the shaper-amplifier in the embodiment illustrated in FIG. 1. The shaper amplifier ac gain is allowed to be relatively large (20 to 30) when waiting for a $V_{thresh}$ input pulse. After a pulse from the detector that is above $V_{thresh}$ has tripped the comparator, the shaper-amplifier gain is allowed to stay high for a predetermined period of time (approximately 3 $\mu$s to 5 $\mu$s). This time is allowed to be long enough to completely capture one pulse. After this time, the ac gain of the shaper-amplifier is actively reduced to near unity. This gain reduction effectively eliminates the possibility of the desired pulse from being altered by a later arriving pulse greater than $V_{thresh}$ in amplitude. As will be discussed in more detail below, the peak capacitor can also be isolated by an electronic switch at the capacitor to achieve the same effect.

As stated earlier, the buffer is a unity gain high input-impedance amplifier with very low input offset current. This buffer amplifier isolates the small peak-hold capacitor from the relatively low impedance of the ADC. This amplifier is designed to drive relatively large capacitance loads of 20 pF. This is required because the flash ADC used in the present system is essentially a string of paralleled gate inputs (vs. a single MOS input; which would be a relatively low input-capacitance). The base-currents of the input of the buffer stage were canceled by a current mirror arrangement. This technique minimizes the peak-detector droop caused by the base currents of the input stage. Base current cancellation typically results in very small effective input current although the sign of this current may be either positive or negative. Because it is nearly impossible to exactly cancel the input base currents, a very small net input current remains (though much smaller in amplitude than if one does not use a canceling technique at all). Using a BiCMOS ASIC one can use MOS transistors to design high impedance input stages with no input bias current and use the bipolar transistors in the gain stages of the amplifier for high transconductance with minimum bias current.

Charge Amplifier

Figure 2:
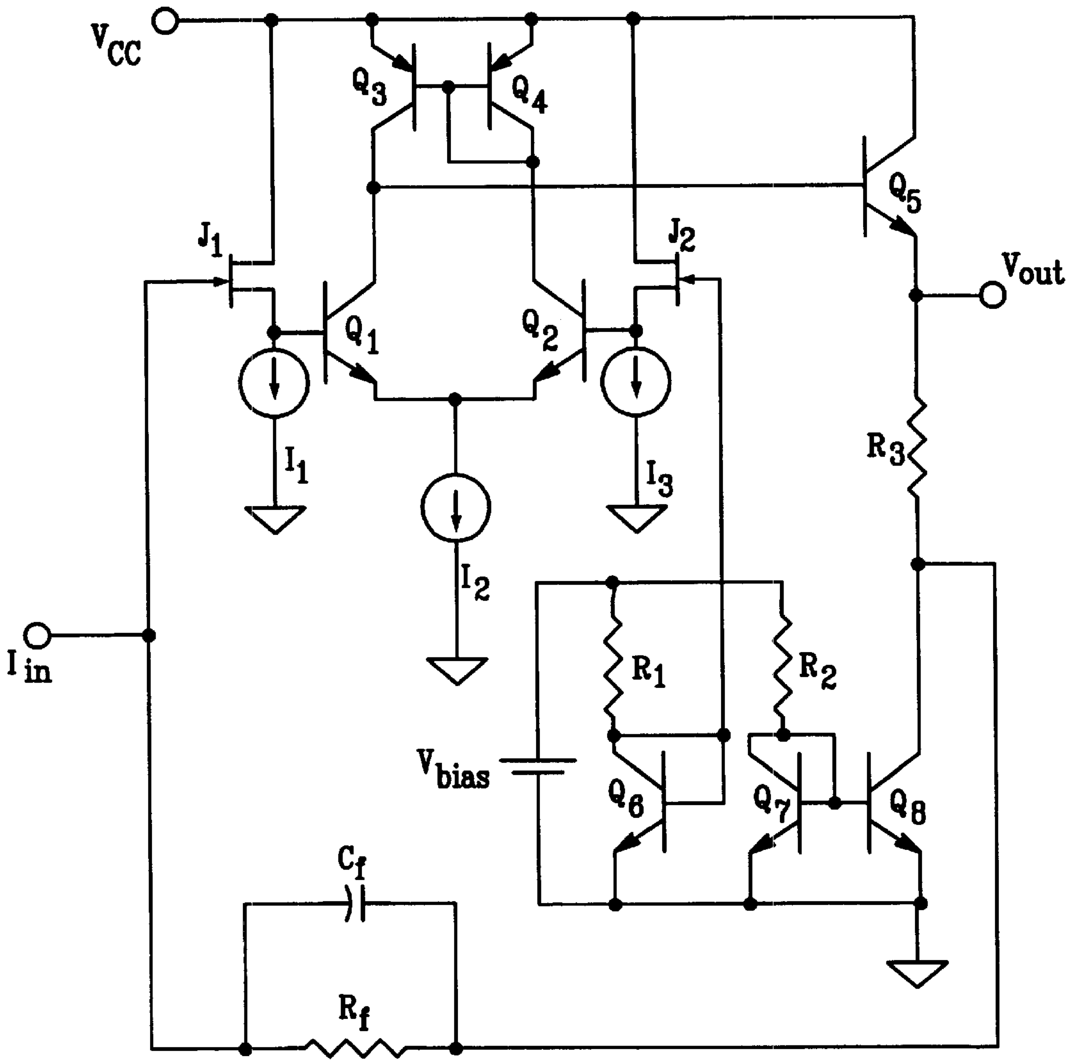
FIG. 2 is an electrical schematic of one implementation of the charge sensitive amplifier subsystem.

A simplified schematic for the charge amplifier in the pulse processing ASIC is shown in FIG. 2. The design intention for this amplifier was to provide a large charge-gain to bias-current ratio and make the output dc voltage fixed to a band-gap reference voltage. This dc output subsequently becomes a reference voltage for the entire pulse-processing ASIC. The use of an active-load differential-amplifier provides a high-gain per unit bias current and allows for common mode noise rejection at the front-end of the amplifier. Current sources $I_1$ and $I_3$ use emitter resistors to minimize noise.

The external matched JFET pair ($J_1$ and $J_2$) is used as a differential-amplifier configuration with $Q_1$ and $Q_2$ as the heart of the differential amplifier. $Q_6$ sets the bias voltage of the base of $Q_2$, and- thus by feedback- the gate of $J_1$. The current-mirror, $Q_7$ and $Q_8$ allow for $V_{out}$ to be biased by $V_{bias}$. These external JFETS could also be integrated into the ASIC.

This amplifier was designed to operate at approximately 0.5 mA total current draw with 40 $\mu$A ($I_1$ and $I_3$ ) of bias in each of the JFETS. This amplifier is an inverting transimpedance amplifier with $R_f/C_f$ as the feedback impedance. The differential-amplifier ($Q_1$, $Q_2$, $Q_3$, and $Q_4$) is biased at 140 $\mu$A ($I_2$). $Q_5$ is a buffer transistor that also supplies a required dc bias shift from the collector $Q_1$ and the output, $V_{out}$. The amplifier output, $V_{out}$, is biased to the system $V_{ref}$ (1.25 V) by the on-chip band-gap voltage reference. This bias voltage, represented by $V_{bias}$ sets the dc voltage at $V_{out}$. Transistors $Q_6$, $Q_7$, $Q_8$ and resistors $R_1$, $R_2$, and $R_3$ comprise a current-mirror bias circuit through which the dc voltage at $V_{out}$ is set. $V_{out}$ will be equal to $V_{bias}$ when $R_1$, $R_2$ and $R_3$ are equal values and $Q_6$, $Q_7$, and $Q_8$ are matched transistors. $R_1$, $R_2$ and $R_3$ were chosen to be 15 kΩ. These resistor values provide a good compromise between circuit performance and power consumption. Ideally, for good circuit performance, $R_3$ should be small to allow the emitter of $Q_5$ to control the collector of $Q_8$ and the associated capacitance at this node, but this would require more power given this ASIC topology. The bias voltage is selected to be relatively low for good dynamic range yet large enough to provide adequate bias voltages around the amplifier. Given these constraints, $V_{bias}$ was chosen to be 1.25 V; a standard band-gap reference voltage. This amplifier is inherently very stable and of relatively high gain due to the single-stage of inverting-gain using high-impedance active loads. The amplifier circuit is phase-compensated by using a parasitic 1 pF capacitor added to the base, collector capacitance of $Q_1$. The external JFETS are n-channel epitaxial devices manufactured by Temic (part# SST404) and have a very small $V_{GS(off)}$ voltage of–2.5 V maximum and –0.5 V minimum. The SST404 is a dual monolithic part in a surface mount package. The feedback resistor, $R_f$, is a 20 MΩ surface mount resistor. To maintain a large system charge-gain with minimum power consumption, the feedback capacitor $C_f$ is the parasitic capacitance of $R_f$; this capacitance is approximately 0.15 pF.

Sharping Amplifier

Figure 3:
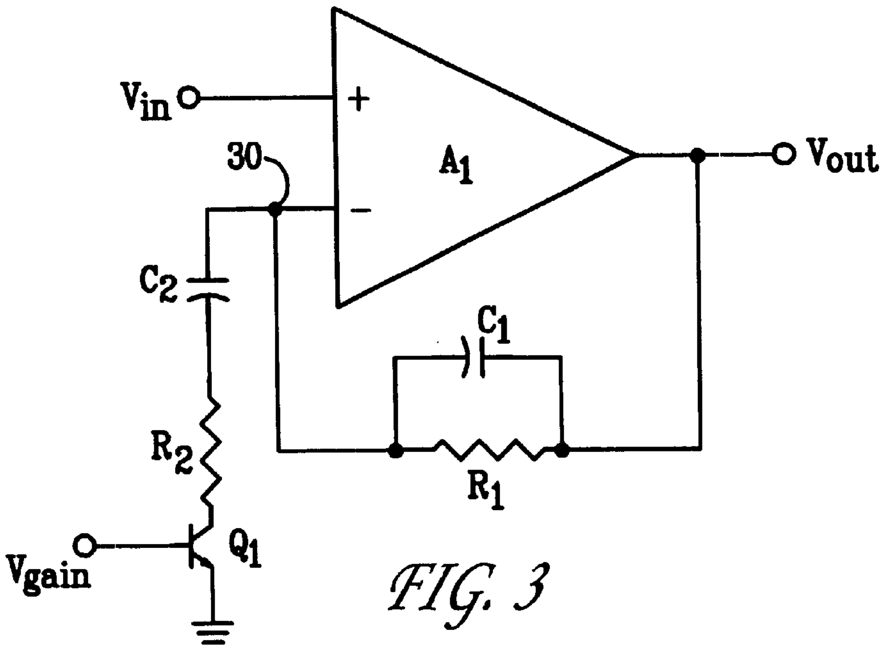
FIG. 3 is an electrical schematic of one implementation of the shaping amplifier subsystem.

A simplified block diagram of the shaper-amplifier design used in this ASIC is shown in FIG. 3. The feedback components, $R_1$, $C_1$, $R_2$, $C_2$ and the impedance of $Q_1$ control the ac gain of this circuit. The dc gain of this circuit is unity due to $C_2$ which is a large value (0.1μF) capacitor. $C_1$ is chosen in combination with $R_1$ and $R_2$ to provide the desired gain and filtering characteristics of the shaper-amplifier function. $V_{gain}$ is a digital "like" signal provided by the comparator and pile-up rejection block; $V_{gain}$ either holds $Q_1$ in saturation or cutoff. The transistor impedance is very low when the device is in saturation ($V_{gain}$ high) and therefore the ac gain of the amplifier is set by the passive feedback components. When $V_{gain}$ is low, the transistor is off and the collector to emitter impedance is very high forcing the ac gain of the amplifier to unity. This gain control allows the rejection of charge- pulses after the initial sampling of a desired pulse. A gain ratio of approximately 20:1 to 40:1 is easily obtained using this technique. This range is typically enough to reject undesired pulses during the processing of a captured sample. In this design $R_1$ was chosen to be 30 kΩ with $C_1$ equal to approximately 10 pF. $R_2$ is set to 1.5 kΩ to provide the desired overall charge-gain of approximately 110 mV/fC and allow for a relatively large, high to low gain ratio.

Figure 9:
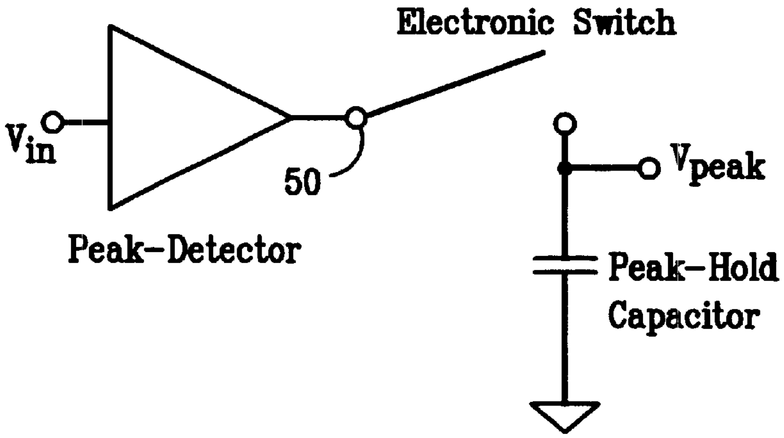
FIG. 9 is a schematic diagram of a switch circuit used to isolate the peak sensing capacitor.

The analog approach to pile-up rejection just described has one serious flaw. When $Q_1$ is turned off (immediately after a charge pulse has been peak-held) a small parasitic voltage pulse is generated at the output of the shaper-amplifier, effectively limiting the low-level sensitivity of this design. For this ASIC, the low-level limit due to this parasitic pulse is approximately 3 fC. Since this system uses a flash ADC, the system acquires a sample and resets in less than 15 μs. Thus, it is possible to use the ASIC without the pile-up rejection circuit if the rate of input pulses is relatively low. An alternative design of the pile-up rejection block has been done to eliminate the parasitic pulse. This new design leaves the shaper-amplifier gain constant but disables the peak-detector circuit instead. This new design appears to have no parasitic glitches. This design is basically a switch that isolates the peak sensing capacitor from inputs from the peak sample and hold subsystem discussed below in response to a control signal from the pile-up rejection circuit. As shown in FIG. 9, this circuit replaces the components immediately downstream from node 50 in FIG. 5, with the Peak-Hold Capacitor of FIG. 9 being the same as $C_{peak}$ in FIG. 5.

Figure 10:
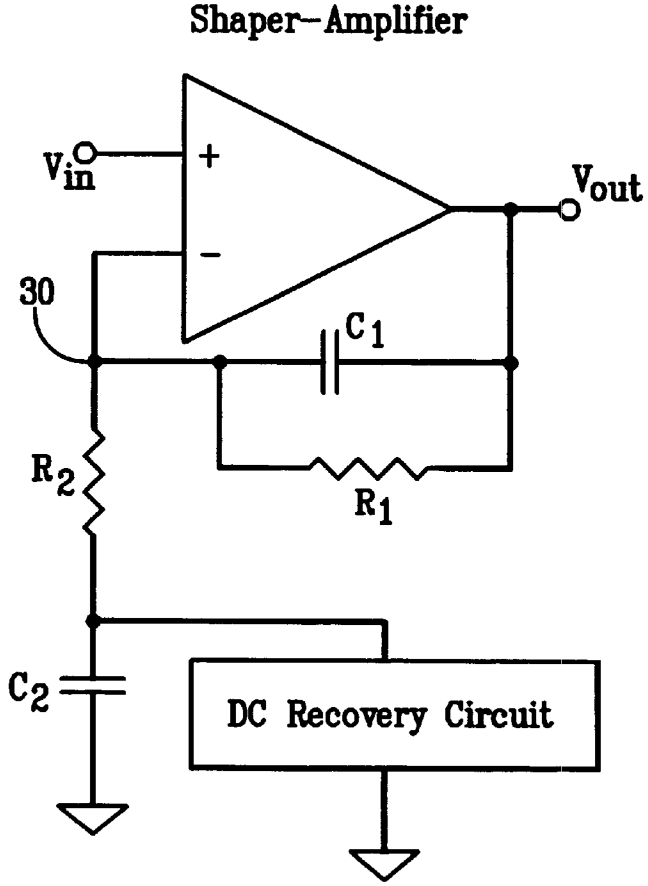
FIG. 10 is a schematic diagram of an alternative shaping amplifier circuit that includes a dc recovery circuit.

This type of circuit has a tendency to oscillate as the initial pulse decays. After a unidirectional pulse has been amplified, typically as a large positive pulse, the voltage is now greater than the reference voltage level at $V_{in}$. The dc recovery circuit will be enabled by a reset function and will allow a low time constant circuit to charge $C_2$ to the desired reference voltage of the system thus allowing for improved overall precision with a fast pulse recovery. This allows for a series of pulses with a high relative frequency to be measured accurately. Those skilled in the art will understand that the performance of this subsystem in terms of recovery time and noise minimization by employing any one of a variety of known dc recovery circuits. The basic scheme for this implementation of a dc recovery circuit with the shaping amplifier is shown in FIG. 10. The changes from FIG. 3 are to the left of node 30 in that figure and below node 30 in FIG. 10.

ADC Reference Input Biasing

Figure 4:
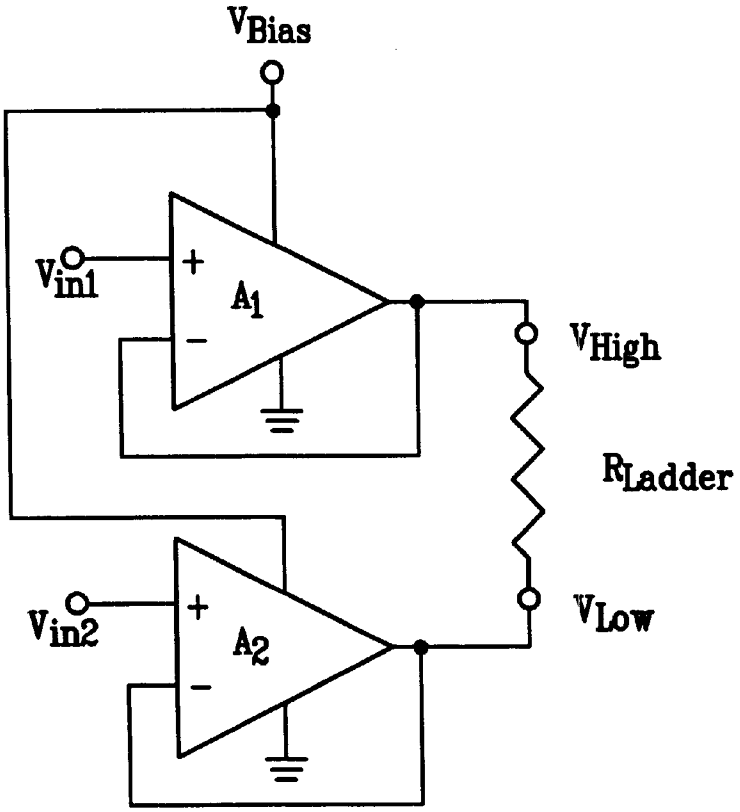
FIG. 4 is an electrical schematic of one implementation of a circuit to provide biasing to the reference inputs of an external flash ADC.

The particular pulse processing ASIC described here is designed to work with another circuit module which incorporates an ADC and histogramming memory features. The ADC in the companion module is an 8 bit flash ADC that utilizes a rather low impedance resistor "ladder" network on its reference inputs. Thus biasing the ladder consumes a sizable amount of power. To minimize system power consumption, the ASIC described here incorporates a ladder bias supply which biases the ADC only when the comparator has detected a pulse of valid amplitude A diagram of the circuit used in the ASIC to supply the required dc reference voltages for the flash ADC ladder resistor network is shown in FIG. 4. This circuit comprises two op-amp circuits, $A_1$ and $A_2$ performing a dual follower function. $A_1$ applies $V_{High}$ to the top of $R_{ladder}$ while $A_2$ applies $V_{Low}$ to the bottom of $R_{Ladder}$. These voltages represent the highest and lowest measurable voltages the ADC will process at its input. Since the ladder resistor can range from 2 kΩ to 5 kΩ and the voltage range of the input will be approximately 5 volts, 2.5 mA (max) is required to bias this resistance. To minimize the system power requirements it is highly desirable to apply this bias voltage for the least amount of time possible. Thus this circuit is designed to apply $V_{High}$, and $V_{Low}$ to $R_{Ladder}$ only when a pulse has triggered the comparator and to be reset to zero bias shortly after the acquisition of the pulse. This is accomplished by using the comparator to bias the circuit via the $V_{bias}$ node when a pulse trips the threshold voltage.

When biased "on", the opamps require approximately 160 μA of current each. They are designed to turn on quickly, have low-offset voltages and operate at minimum possible current.

Peak Detector

The final stage of analog pulse processing that is performed by the ASIC is the peak sample, and hold function. In conventional pulse processing systems the peak sample and hold is usually incorporated as part of the ADC, but here it has been incorporated as part of the pulse processing ASIC.

Figure 5:
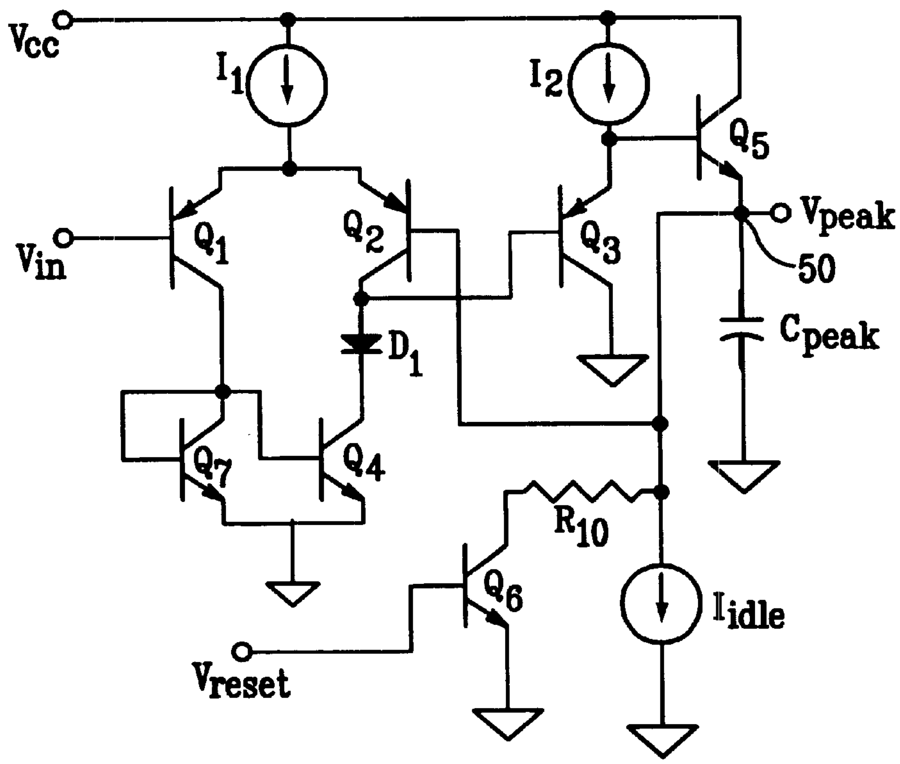
FIG. 5 is an electrical schematic of one implementation of the peak sample and hold subsystem.

A simplified schematic of the peak detector used in this ASIC design is shown in FIG. 5. $I_1$ is approximately 120 μA and $I_2$ is approximately 50 μA. $I_{idle}$ is 5 μA or 0 μA and is controlled by the comparator. $I_{idle}$ is turned off when the output of the comparator senses an $V_{thresh}$ input pulse. $C_{peak}$ is an external 400 pF capacitor, although it could also be incorporated on the ASIC. A pnp ($Q_1$,$Q_2$) based differential-amplifier was chosen for this design. The input is biased at the system $V_{ref}$(1.25 V) from the shaper-amplifier. The input is on the base of $Q_1$ and the feedback from the peak hold capacitor, $C_{peak}$, is feedback to the base of $Q_2$. After a positive going peak has been held on $C_{peak}$ and the input returns to base line dc, $Q_2$ will be cutoff and therefore the base current of $Q_2$ will be near zero and not discharge $C_{peak}$. Using this topology with an npn design would undesirably leave an active base on $C_{peak}$ and allow a very significant discharge path. $Q_3$ is an emitter follower stage that guarantees that $Q_2$ cannot be saturated. When the circuit is idling or following a positive going signal $Q_3$ biases the collector to emitter voltage of $Q_2$ at approximately one diode drop. With $I_{idle}$ "on" this circuit is essentially a low-offset, unidirectional follower circuit. For good low-level accuracy and low overshoot $I_{idle}$ is sourced from emitter of $Q_5$ until the threshold comparator trips and then $I_{idle}$ is reduced to zero and a peak-hold is obtained. The offset of this design is also low because the $Q_3$ base-current is relatively small compared to the collector currents of $Q_1$–$Q_2$; allowing the differential amplifier to control the peak very accurately. The overshoot is essentially zero because the circuit is actively servoing the $C_{peak}$ with all devices on and in the linear region of operation before $V_{thresh}$ is sensed. When $I_{idle}$ is turned off, the emitter current of $Q_5$ is determined by the charge current into $C_{peak}$ and the circuit is very linear in operation. When the peak of the input has occurred and the input is decreasing, $Q_2$ and $Q_5$ are turned off and the current-leakage paths from $C_{peak}$ are very low.

One problem with this type of peak-detector design is that there is a limit to the amplitude of the detected signal. This limitation is the reverse breakdown voltage of $Q_5$ (approximately 5.6 V). To make this limitation have the least impact on the system performance, diode $D_1$ was added. This arrangement holds the collector voltage, $Q_2$, at one diode drop above ground plus the saturation voltage of $Q_4$ after a peak has been held and $Q_4$ is on hard. The addition of $D_1$ allows one diode drop greater peak voltage out before reverse breakdown of $Q_5$ occurs than if $D_1$ was not used (approximately 6.9 volts compared to 6.3 volts).

Finally, $Q_6$ and $R_{10}$ make up a reset network. The system reset circuitry biases $V_{reset}$ high to remove the charge on $C_{peak}$ while $R_{10}$ limits the current $Q_5$ can provide to ground during the reset process.

Results

A version of the pulse processing circuit was built using Honeywell's ALB1A bipolar ASIC fabrication process. The resulting ASIC dice were 4 mm×5 mm in size and were packaged in a 40 pin leadless chip carrier (LCC) for initial testing. The packaged ASICs were attached to a standard FR4 printed circuit board with surface mount external components for testing. Radiation detectors were attached to the ASIC test board using microdot and BNC connectors.

The gain and linearity of the ASIC module were measured by injecting a voltage pulse from an Ortec 419 Precision Pulse Generator into the input of the ASIC using an Ortec "charge terminator" (2 pF capacitor terminated 100 Ω to ground). The tail pulse generator and terminator had previously been calibrated with a silicon detector and the amount of charge injected into the ASIC was known to good precision. After injecting the fixed amplitude charge pulses into the ASIC input, the distribution of pulses produced at the output of the shaping amplifier was monitored with an Aptec Series 5000 multi-channel analyzer (MCA). The centroid of the peaks produced in the pulse height spectrum were used to determine the gain and linearity of the ASIC as shown in the graph in FIG. 6.

Figure 6:
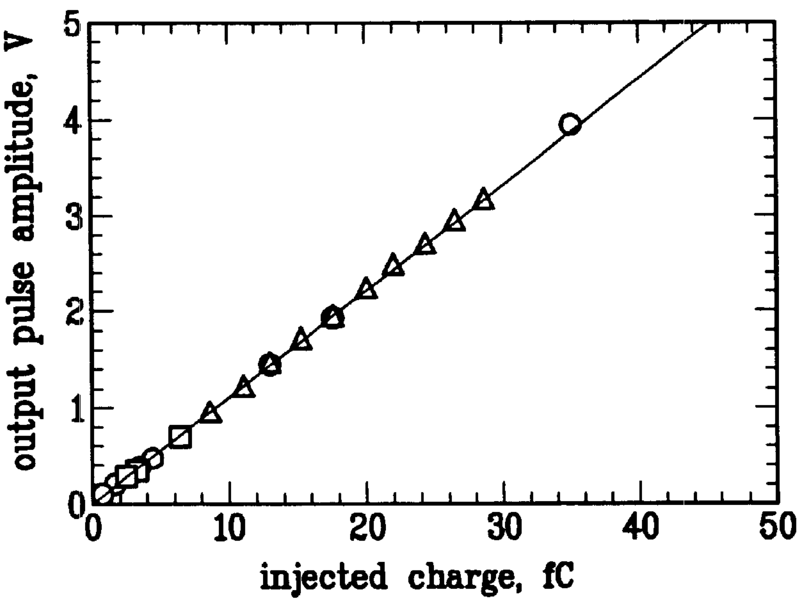
FIG. 6 is a graph showing the ASIC charge and shaping amplifier gain, showing output amplitude as a function of injected charged.

The output of the shaper amplifier was plotted in FIG. 6 versus a calibrated fixed charge pulse provided to the preamplifier input. Open symbols are measured laboratory data and the solid line is a linear fit to the data using a "least squares" algorithm. These data allow a determination of the overall system (preamplifier and shaping amplifier) gain and linearity. The slope of the least squares fit yields a system gain of 110 mV/fC (18 $\mu$V/electron), close to the original design specification. The correlation coefficient of the fit indicates a linearity of better than 0.1%.

By measuring the width of the peaks in the pulse height spectra (using the apparatus just described), the noise of the circuit (ENC) was found to be 538 electrons rms,(1270 electrons FWHM); well within the design specifications.

Figure 7:
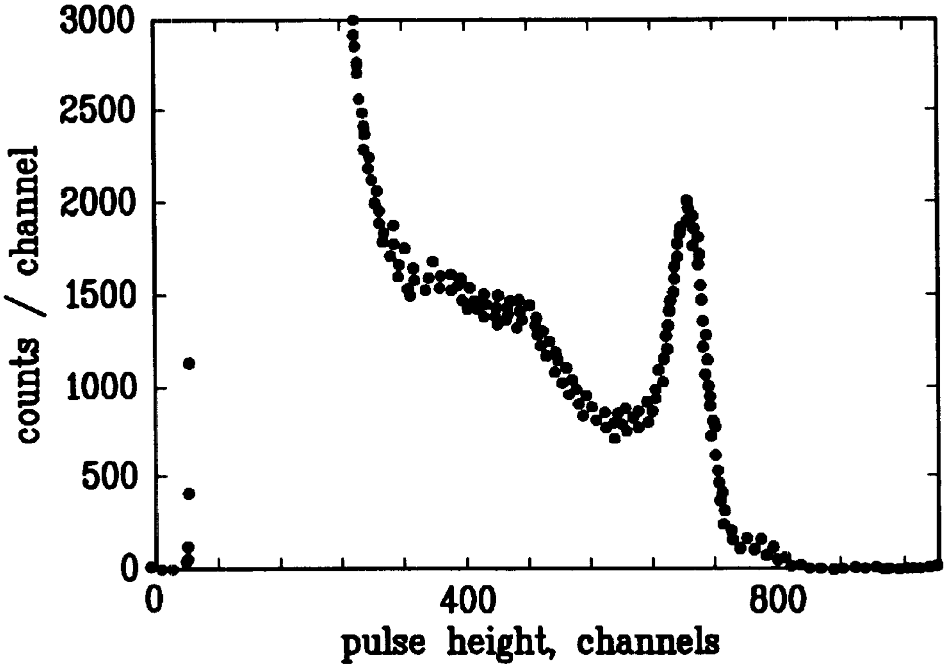
FIG. 7 is a graph of the pulse height spectrum of a $^{57}$Co source measured by this ASIC.

The ASIC was also operated in its intended mode as a gamma-ray spectrometer using two different detectors. A gamma-ray pulse height spectrum obtained by attaching a silicon p-i-n photodiode (Hamamatsu S1223) to the ASIC in an ac coupled configuration is shown in FIG. 7. The pulse height spectrum shown in FIG. 7 was obtained by irradiating a silicon p-i-n photodiode (Hamamatsu S1223) with a $^{57}$Co source. The pulse processing ASIC described above was used to amplify and shape the pulses from the detector. The 122 keV peak is clearly visible.

Figure 8:
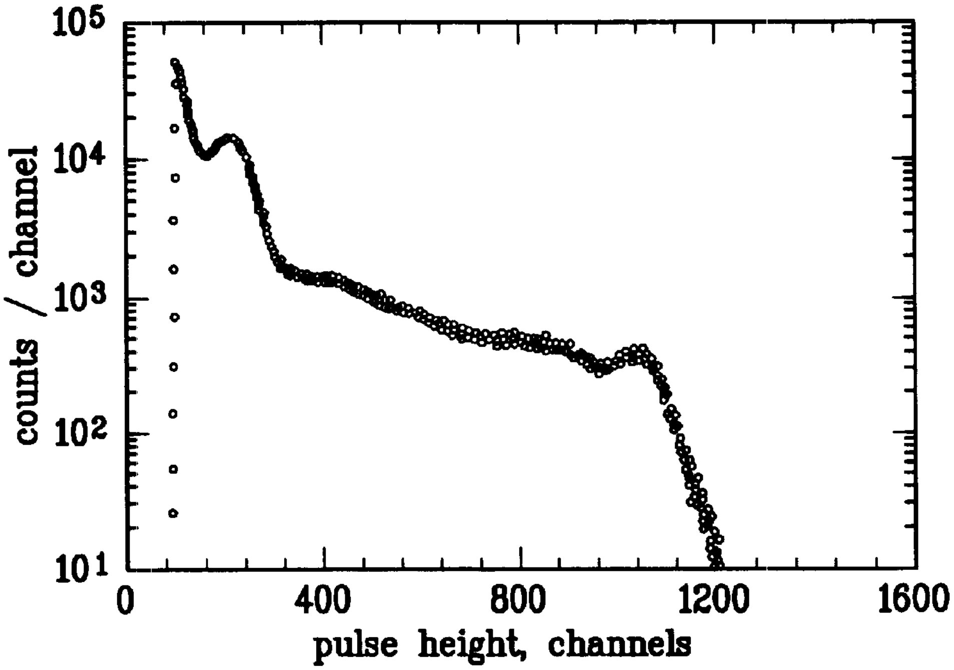
FIG. 8 is a graph of the pulse height spectrum of a $^{133}$ Ba source measured by this ASIC.

The same commercial pulse height analyzer (Aptec Series 5000) was used to histogram the pulse amplitudes, and a $^{57}$Co source was used to irradiate the detector. FIG. 8 shows a pulse height spectrum obtained with a CZT detector attached to the detector, and irradiated with a $^{133}$Ba source.

The pulse height spectrum was obtained by irradiating a 15 mm×15 mm×2 mm CZT detector with photons from $^{133}$Ba and reading out the detector with the ASIC described in the text. The CZT detector was of "spectroscopic grade" and was operated at a bias of 100 V. The peak-detector circuit was also evaluated for:droop (decay of the peak held voltage as a function of time), offset and overshoot. The droop measures approximately 100 $\mu$V/$\mu$s and the offset is less than 10 $\mu$V, this offset includes the buffer circuit. The peak-detector exhibits no measurable overshoot. The droop is caused by the comparator circuit input bias current. This droop is perfectly acceptable for this application due to the rapid digitization of the flash A/D. The peak detector need only hold the sample for approximately 10 $\mu$s before digitization, which implies a 1 mV maximum error; this is well below the overall system noise floor.

What is claimed is:

1. An analog pulse processor implemented as an integrated circuit comprising:

a charge amplifier adapted to receive a charge pulse signal from a detector and to provide an ac amplified output voltage from the charge pulse signal when the charge pulse signal is above an adjustable threshold dc voltage level that is slightly above a constant reference dc voltage level, the adjustable threshold dc voltage level and the constant reference dc voltage level being supplied by a voltage reference source;

a shaping amplifier that ac amplifies and filters the ac amplified output voltage of the charge amplifier and provides an output;

a peak detector circuit that receives the output of the shaping amplifier and charges a peak sensing capacitor to a voltage level proportional to the strength of the charge pulse signal from the detector;

a comparator that receives the adjustable threshold dc voltage level and the voltage level of the peak sensing capacitor and provides an enable pile-up rejection output signal when the charge pulse signal is above the adjustable threshold dc voltage level, and further provides sample ready and reset signals;

a pile-up rejection circuit that receives the enable pile-up rejection output signal and provides a pile-up rejection output which is directed to a gain control input of the shaping amplifier or to an electronic switch located between the peak detector circuit and the peak sensing capacitor to disable charging of the peak sensing capacitor for a period of time sufficient for the processor to complete the processing of a single charge pulse signal from the detector once a first such charge pulse signal has been entered into the peak sensing capacitor without interference from an overlapping following another charge pulse signal;

a buffer amplifier that receives the voltage level from the peak sensing capacitor and provides a peak hold output signal; and a ladder bias circuit that receives a low ladder voltage and a high ladder voltage from the voltage reference source and further receives an enable ladder bias signal from the comparator and provides a low ladder bias voltage output and a high ladder bias voltage output when the charge pulse signal is above the adjustable threshold dc voltage level.

2. The processor of claim 1 further including an analog to digital converter (ADC) that receives the peak hold output signal from the buffer amplifier and the low and high ladder bias voltage outputs from the ladder bias circuit and provides a digital output signal containing pulse height information for the charge pulse signal.

3. The processor of claim 1 wherein the peak detector circuit is disabled from charging the peak sensing capacitor by providing the pile-up rejection output to the electronic switch located between the peak detector circuit and the peak sensing capacitor.

4. The processor of claim 1 wherein the peak detector circuit is disabled from charging the peak sensing capacitor by providing the pile-up rejection output to the gain control input of the shaping amplifier to reduce the gain of the shaping amplifier to a low state when the comparator senses that the peak sensing capacitor has been charged.

5. The processor of claim 1 wherein the peak sensing capacitor is part of the integrated circuit.

6. The processor of claim 1 wherein the detector is a radiation detector.

7. The processor of claim 6 wherein the radiation detector is a cadmium zinc telluride detector or a silicon p-I-n photodiode.

8. An analog pulse processor implemented as an integrated circuit comprising:

a charge amplifier adapted to receive a charge pulse signal from a detector and to provide an ac amplified output voltage from the charge pulse signal when the charge pulse signal is above an adjustable threshold voltage level that is slightly above a constant reference voltage level, the adjustable threshold voltage level and the constant reference voltage level being supplied by a voltage reference source;

a shaping amplifier that ac amplifies the ac amplified output voltage of the charge amplifier and provides an output, with the shaping amplifier further being connected to a dc recovery circuit that resets a capacitor voltage in the shaping amplifier to the constant reference voltage level after ac amplifying the ac amplified output voltage of the charge amplifier;

a peak detector circuit that receives the output of the shaping amplifier and charges a peak sensing capacitor to a voltage level proportional to the strength of the charge pulse signal from the detector;

a comparator that receives the adjustable threshold voltage level and the voltage level of the peak sensing capacitor and provides an enable pile-up rejection output signal when the charge pulse signal is above the adjustable threshold voltage level;

a pile-up rejection circuit that receives the enable pile-up rejection output signal from the comparator and provides an output that disables the peak detector circuit from charging the peak sensing capacitor for a period of time sufficient for the processor to complete the processing of a single charge pulse signal from the detector once a first such charge pulse signal has been entered into the peak sensing capacitor through the action of an electronic switch activated by the output of the pile-up rejection circuit to open and thereby disconnect the peak detector circuit from the peak sensing capacitor with the electronic switch being closed after a period of time;

a buffer amplifier that amplifies the voltage level on the peak sensing capacitor and provides a peak hold output; and a ladder bias circuit that receives a low ladder voltage and a high ladder voltage from the voltage reference source and further receives an enable ladder bias signal from the comparator and provides a low ladder bias voltage output and a high ladder bias voltage output when the charge pulse signal is above the adjustable threshold voltage level.

9. The processor of claim 8 further including an analog to digital converter (ADC) that receives the peak hold output from the buffer amplifier and the low and high ladder bias voltage outputs from the ladder bias circuit and provides a digital output signal containing pulse height information for the charge pulse signal.

10. The processor of claim 8 wherein the peak sensing capacitor is part of the integrated circuit.

11. The processor of claim 8 wherein the detector is a radiation detector.

12. The processor of claim 11 wherein the radiation detector is a cadmium zinc telluride detector.

13. The processor of claim 8 wherein the detector is a silicon p-I-n photodiode.

14. The processor of claim 8 wherein the processor is adapted to draw less than about 2 mA when no charge pulse signals above the adjustable threshold voltage level are being processed.

* * * * *